United States Patent
He et al.

(10) Patent No.: US 11,549,985 B2
(45) Date of Patent: Jan. 10, 2023

(54) POWER ELECTRONIC CIRCUIT FAULT DIAGNOSIS METHOD BASED ON EXTREMELY RANDOMIZED TREES AND STACKED SPARSE AUTO-ENCODER ALGORITHM

(71) Applicant: WUHAN UNIVERSITY, Hubei (CN)

(72) Inventors: Yigang He, Hubei (CN); Yaru Zhang, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 570 days.

(21) Appl. No.: 16/680,532

(22) Filed: Nov. 12, 2019

(65) Prior Publication Data

US 2020/0386811 A1 Dec. 10, 2020

(30) Foreign Application Priority Data

Jun. 5, 2019 (CN) .......................... 201910487255.8

(51) Int. Cl.
| | |
|---|---|
| *G01R 31/3183* | (2006.01) |
| *G06N 20/00* | (2019.01) |
| *G06K 9/62* | (2022.01) |
| *G06N 5/00* | (2006.01) |
| *G06F 30/398* | (2020.01) |
| *G06F 30/3308* | (2020.01) |
| *G06F 30/33* | (2020.01) |

(52) U.S. Cl.
CPC ..... *G01R 31/318342* (2013.01); *G06F 30/33* (2020.01); *G06F 30/3308* (2020.01); *G06F 30/398* (2020.01); *G06K 9/623* (2013.01); *G06K 9/6268* (2013.01); *G06N 5/003* (2013.01); *G06N 20/00* (2019.01)

(58) Field of Classification Search
CPC .............................................. G01R 31/318342
USPC .......................................................... 714/25
See application file for complete search history.

(56) References Cited

U.S. PATENT DOCUMENTS

2020/0202252 A1* 6/2020 Asbag .................. G06F 16/285

* cited by examiner

*Primary Examiner* — Eric D Lee
(74) *Attorney, Agent, or Firm* — JCIPRNET

(57) ABSTRACT

A power electronic circuit fault diagnosis method based on Extremely randomized trees (ET) and Stack Sparse auto-encoder (SSAE) algorithm includes the following. First, collect the fault signal and extract fault features. Then, reduce the dimensionality of fault features by calculating the importance value of all features using ET algorithm. A proportion of the features to be eliminated is determined, and a new feature set is obtained according the value of importance. Further extraction of fault features is carried by using SSAE algorithm, and hidden layer features of the last sparse auto-encoder are obtained as fault features after dimensionality reduction. Finally, the fault samples in a training set and a test set are input to the classifier for training to obtain a trained classifier. And mode identification, wherein the fault of the power electronic circuit is identified and located by the training classifier.

8 Claims, 3 Drawing Sheets

POWER ELECTRONIC CIRCUIT FAULT DIAGNOSIS METHOD BASED ON EXTREMELY RANDOMIZED TREES AND STACKED SPARSE AUTO-ENCODER ALGORITHM

CROSS-REFERENCE TO RELATED APPLICATION

This application claims the priority benefit of China application serial no. 201910487255.8, filed on Jun. 5, 2019. The entirety of the above-mentioned patent application is hereby incorporated by reference herein and made a part of this specification.

BACKGROUND OF THE INVENTION

Field of the Invention

The disclosure relates to a power electronic circuit fault diagnosis method, and in particular, to a fault diagnosis method of power electronic circuits based on Extremely randomized trees (ET) and Stack Sparse Auto-encoder (SSAE) algorithm.

Description of Related Art

As an emerging basic subject of integrated applied technology, power electronics technology is expanding its fields of application as technology advances and develops. Currently, applications of power electronic devices are found in the fields of defense military, aerospace science, power conversion and transmission, and information communication. Specifically, as an important constituent part of the power electronic device, the power electronic circuit is mainly composed of a main circuit and a control circuit. In actual operation, the probability of fault occurrence in the main circuit is far higher than that in other components, and a fault occurring in any component may cause an abnormal operating state of the whole system and device. Therefore, it is very important to monitor the operating state of the power electronic circuit and to make a rapid diagnosis of the failure.

At present, fault detection and diagnosis methods are mainly classified into three categories: model-based methods, signal-based methods, and knowledge-based methods Model-based approaches can be divided into parameter estimation and state estimation, which need to establish the model of the circuit to be diagnosed. For signal-based fault diagnosis methods, the first step is to select the appropriate circuit signal, such as current signal and voltage signal. Then the signal processing method is used to analyze the characteristics of the signal in time domain, frequency domain or other domains. The analyzing methods mainly include Fourier transform, Park transform and wavelet transform methods. However, the result of signal processing through the method may not have actual physical meaning, and the process may lead to loss of effective fault information. Even more, when there are multiple fault types, the fault features selected after the transformation cannot effectively distinguish among different fault types. For knowledge-based fault diagnosis method, it can extract the hidden features of variables by using a variety of artificial intelligence techniques and a large volume of historic data. Currently, as the development of artificial intelligent techniques, intelligent algorithms, such as back propagation (BP) neural network, have been widely used in fault monitoring, diagnosis and prediction as well as the life prediction of components. However, when BP neural network is adopted, it is easy to fall into the local optimal state in the training process, and there is great blindness in the selection of initial connection weights and thresholds. Therefore, it is very difficult to select the fault feature vector and adjust the parameters. r.

SUMMARY OF THE INVENTION

In order to solve the limitation of the current fault diagnosis method, the invention provides a method for combining Extremely randomized trees and Stack Sparse Auto-encoder algorithms, which is used for performing fast and accurate component-level fault location on power electronic circuits.

The technical solution adopted by the invention to solve the technical problems is as follows:

providing a power electronic circuit fault diagnosis method based on Extremely randomized trees (ET) and Stack Sparse Auto-encoder (SSAE) algorithms including:

1) signal collection and feature extraction, wherein empirical mode decomposition (EMD) is performed on current signals in each fault state of a power electronic circuit to obtain multi-order intrinsic mode function (IMF) components, and then the time-domain, frequency-domain features and energy feature of each order of the IMF component are calculated and used as an original features dataset;

2) fault feature dimensionality reduction preprocessing, wherein an importance score of all features is calculated by ET algorithm, then and the features are sorted in descending order according a value of the importance score, and a new feature set is obtained by removing the features with a low importance score with a determined proportion;

3) extraction of fault features, wherein the SSAE is composed of multiple sparse auto-encoders which is used to reduce a dimension of the fault features layer by layer, and hidden layer features of the final sparse auto-encoder are obtained as final fault features;

4) classification training, wherein the fault features samples under different fault conditions are divided into a training set and a test set according to the determined proportion, and the training set are used to train a classifier;

5) mode identification, wherein by using the trained classifier, a fault identification and a fault location of the diagnosed power electronic circuit are carried out.

Further to the above technical solution, in step 1), first 7-order IMF components are selected to calculate the fault features of the power electronic circuit.

Further to the above technical solution, in step 3), a network composed of two layers of sparse auto-encoder is selected to optimize the fault features of the power electronic circuit.

Further to the above technical solution, the ET algorithm in step 2) measures the value of the importance score of the feature by calculating Gini index of a decision tree node.

Further to the above technical solution, specifically, in step 2):

assume that there are m features $X_1, X_2, X_3, \ldots, X_m$, and the importance score of each feature is represented by the Gini index $VIM_j^{(Gini)}$, i.e., an average variation amount of node splitting impurity of a $j^{th}$ feature $X_j$ in all decision trees of the ET, a formula for calculating the Gini index is:

$$GI_m = \sum_{k=1}^{K} \sum_{k' \neq k} p_{mk} p_{mk'} = 1 - \sum_{k=1}^{K} p_{mk}^2$$

where K means K categories, and $p_{mk}$ represents a proportion of a category k in a node m, the importance score of the feature $X_j$ at the node m, i.e., a variation amount of the Gini index before and after the node m branches, is:

$$VIM_{ij}^{(GINI)} = \sum_{m \in M} VIM_{jm}^{(GINI)}$$

where $GI_l$ and $GI_r$ respectively represent the Gini indices of two new nodes after branching, if the node in which the feature $X_j$ appears in a decision tree i is in a set M, then the importance score of $X_j$ in the $i^{th}$ tree is:

$VIMI_{ij}^{(GINI)} = \sum_{m \in M} VIM_{jm}^{(GINI)}$, assume that the ET has n trees in total, then $$VIM_j^{(GINI)} = \sum_{i=1}^{n} VIM_{ij}^{(GINI)}$$

the importance score of the feature may be obtained by performing a normalization:

$$VIM_j = \frac{VIM_j}{\sum_{i=1}^{c} VIM_i},$$

and the importance score of the feature obtained after calculation are sorted in a descending order, and finally, a new feature set is obtained by removing the features with low importance score with the determined proportion.

The invention further provides a computer-readable storage medium, having a computer program executable by a processor, the computer program performing steps of the power electronic circuit fault diagnosis method based on an extremely random forest (ET) and a stacked sparse auto-encoder (SSAE) algorithm according to the above technical solution.

The advantages of the invention are as follows: The power electronic circuit fault diagnosis of the invention combines the ET and the SSAE algorithm. First, feature selection is performed through the ET algorithm, and fault features with lower importance score are discarded to avoid overfitting which occurs when the raw fault feature data is directly applied to train the classifier. Then, dimensionality of the fault features is reduced by using the SSAE algorithm to avoid a long training time due to overly high dimensionality of the feature data and meanwhile effectively improve the accuracy of the power electronic circuit fault diagnosis, thereby achieving advantages that are not found in using one of the methods alone.

BRIEF DESCRIPTION OF THE DRAWINGS

The invention will be further described below with reference to the accompanying drawings and embodiments. The accompanying drawings are as follows.

DESCRIPTION OF THE EMBODIMENTS

Figure 1:
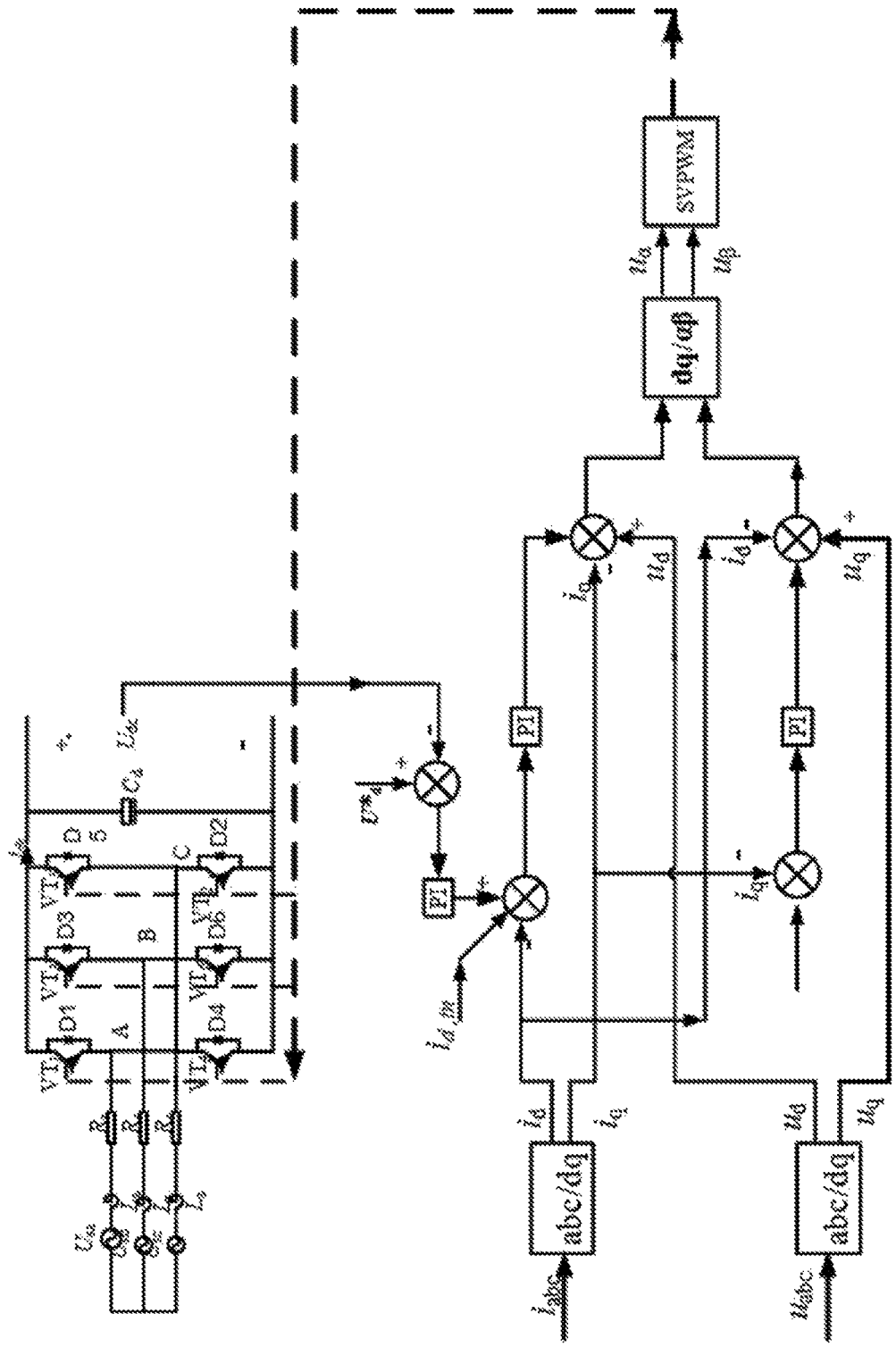
FIG. 1 is a simulation model of a three-phase voltage-type PWM rectifier according to an embodiment of the invention.
Figure 2:
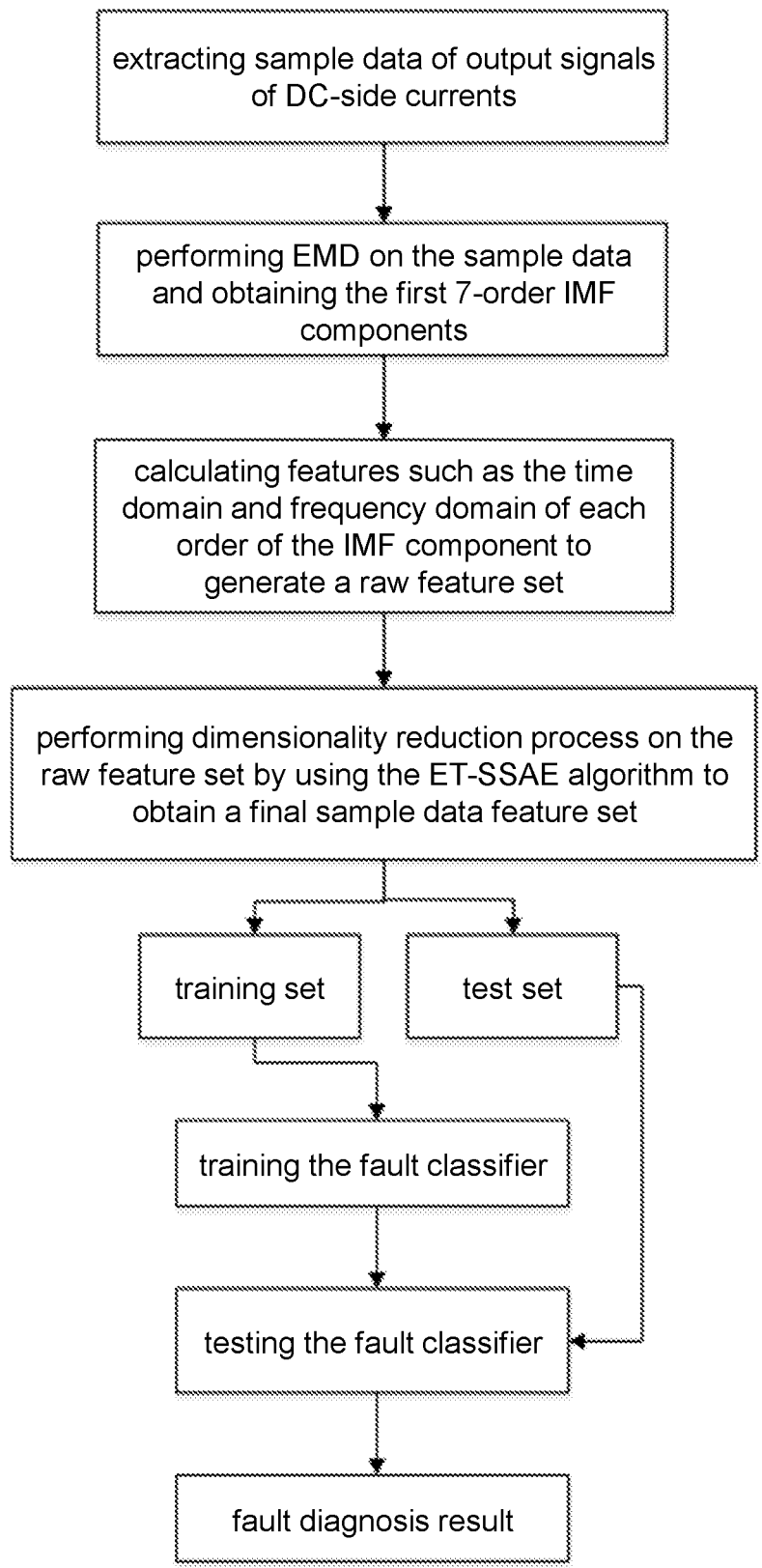
FIG. 2 is a flowchart of a fault diagnosis model according to an embodiment of the invention.

For a further understanding of the objects, technical solutions and advantages of the present invention, the present invention will be described in further detail below with reference to the accompanying drawings and embodiments. It is understood that the specific embodiments described herein are merely meant to illustrate, rather than limit, the invention.

A power electronic circuit fault diagnosis method based on ET and SSAE algorithm according to the invention includes the following steps.

1) Signal collection and feature extraction. EMD is performed on current signals obtained in each fault state. Herein, the first 7-order IMF components are selected, and the time domain, frequency domain, and energy features of each order IMF component are calculated to obtain a raw feature dataset.

2) Fault feature dimensionality reduction preprocessing. Importance score of all features are calculated by using the Extra trees (ET) algorithm and are sorted in a descending order. A proportion of the features to be eliminated is determined, and after elimination, a new feature set is obtained. Fault features with lower importance scores are discarded to avoid overfitting which occurs when the raw fault feature data is directly applied to train the classifier.

3) Further extraction of fault features. The feature data with smaller dimensionality and being more representative is obtained by using the stacked sparse auto-encoder (SSAE) algorithm. In the present embodiment of the invention, by using the stacked sparse auto-encoder algorithm, multiple sparse auto-encoders are cascaded and features are extracted layer by layer to reduce the dimensionality of the fault features. The hidden layer features of the last sparse auto-encoder are obtained as fault samples to avoid a long training time resulting from overly high dimensionality of the feature data. Then, the fault samples in cases of different faults are taken as a dataset which is divided into a training set and a test set according to a determined proportion.

4) Mode identification. Labels of the sample data are set according to fault types, as shown by the codes in Table 1. After the training set and test set are set, the training set samples are input to the classifier to train the classifier. Then, the classifier is tested by using the test set, and the adopted classifier is the MLP-Classifier in the sklearn module, thereby realizing component-level positioning of a power electronic circuit fault.

Further, in step 1), each IMF component respectively includes components of different characteristic time scales of the signal, and the residual component represents an average trend of the signal. Therefore, feature information reflecting the power electronic circuit fault can be extracted from the IMF components of the circuit output signal.

Further, the ET algorithm in step 2) measures the feature importance score by calculating purity of a decision tree node based on the Gini index (GI), and the specific implementation solution is as follows.

It is assumed that there are m features $X_1, X_2, X_3, \ldots, X_m$, and the variable importance measure (VIM) of each feature can be represented by the Gini index measure $VIM_{jm}^{(Gini)}$ i.e., the average variation amount of node splitting impurity of the $j^{th}$ feature $X_j$ in all decision trees of the ET.

The formula for calculating the Gini index is:

$$GI_m = \Sigma_{k=1}^{K} \Sigma_{k' \neq k} p_{mk} p_{mk'} = 1 - \Sigma_{k=1}^{K} p_{mk}^2 \quad (1)$$

where K means there are K categories, and $p_{mk}$ represents the proportion of a category k in a node m.

The importance score of the feature $X_j$ at the node m, i.e., the variation amount of the Gini index before and after the node m branches is as follow:

$$VIM_{ij}^{(GINI)} = GI_m - GI_l - GI_r \quad (2)$$

where $GI_l$ and $GI_r$ respectively represent the Gini index of the two new nodes after branching.

If the node in which the feature $X_j$ appears in a decision tree i is in a set M, then the importance score of $X_j$ in the $i^{th}$ tree is:

$$VIM_{ij}^{(GINI)} = \Sigma_{m \in M} VIM_{jm}^{(GINI)} \quad (3)$$

It is assumed that the ET has n trees in total, then $$VIM_j^{(GINI)} = \Sigma_{i=1}^{n} VIM_{ij}^{(GINI)} \quad (4)$$

Finally, normalization processing is performed, and the importance score of the feature may be obtained as:

$$VIM_j^{(GINI)} = \Sigma_{i=1}^{n} VIM_{ij}^{(GINI)} \quad (5)$$

Finally, the feature importance score obtained by calculation are sorted in a descending order, and the proportion of the features to be eliminated is determined. After elimination, a new feature set is obtained.

Further, in step 3), the structural principle of the stacked sparse autoencoder network is as follows:

1) First of all, the learning process of the autoencoder consists of the following two processes.

1. First, an encoding process. Assuming that the input sample data is x: $\{x_1, x_2, x_3, \ldots, x_n\}$, by using the encoding function, each input sample $x_n$ is encoded and converted into a vector h: $\{h_1, h_2, h_3, \ldots, h_n\}$ of the hidden layer. The formula of the encoding function is shown as follows:

$$h_v(x) = \sigma_v(W_v \cdot x + b_v) \in R^v \quad (6)$$

where $\sigma_v(\ )$ is the network activation function, $\{W_v, b_v\}$ are the network parameters, wherein $W_v$ is the weight of the input layer and the hidden layer, $b_v$ is the bias of the encoding network, and v is the number of hidden layer units.

2. A decoding process. Vector reconstruction is performed on the vector of the hidden layer obtained in the decoding process by using a decoding function to obtain a prediction estimate of the input samples. The formula of the decoding function is shown as follows:

$$\tilde{x} = \sigma_h(W_h \cdot x + b_h) \in R^u \quad (7)$$

where $\sigma_h(\ )$ is the network activation function, $\{W_h, b_h\}$ are the network parameters, wherein $W_h$ is the weight of the hidden layer and the output layer, $b_h$ is the bias of the decoding network, and u is the number of output layer units.

When vector reconstruction is performed in the decoding process, an error between the actual input x and the predicted estimation output $\tilde{x}$ is obtained. Since the purpose of training the auto-encoder network is to ensure that the actual input x of the network and the predicted estimation output $\tilde{x}$ are as consistent as possible, it is necessary to construct an error loss function to calculate the error of the network and obtain an optimization objective function to thereby obtain an optimal output result. The optimization objective function constructed based on energy loss according to the invention is:

$$\min_\theta J(\theta) = \frac{1}{N} \sum_{n=1}^{N} \|\tilde{x}^{(n)} - x^{(n)}\|^2 + \delta \cdot R(\theta) \quad (8)$$

where an output $\tilde{x}^{(n)}$ in the loss term is a prediction of an input $x^{(n)}$, and the expected output thereof is $x^{(n)}$. Moreover, the parameter and the regular term are defined as:

$$\begin{cases} \theta = [W_v, b_v; W_h, b_h] \\ R(\theta) = \|W_v\|^2 + \|W_h\|^2 \end{cases} \quad (9)$$

where N is the number of input samples, and δ is the attenuation coefficient. In the invention, by using the back propagation (BP) algorithm and the gradient descent method, the network weight is adjusted, and the value of the error function is reduced through iteration. If the final output vector $\tilde{x}$ is close to the input vector x, it means that relevant information of high-dimensional features is present in the vector h of the hidden layer, so that the output vector of the hidden layer can represent the features of the input data.

2) With respect to the stacked sparse auto-encoder network, in the training process of the auto-encoder network, the neuron nodes associated with the input data are brought into an active state through limitation on the active state of part of the network in the hidden layer to thereby realize extraction of high-dimensional features. Such limitation that causes part of the neuron network to be in a non-active state is referred to as sparsity of the auto-encoder network. In general, when the output of the neuron is close to 1, it is defined as being activated, and when the output is close to 0, it is defined as being suppressed. As such, the limitation that causes the neuron to be suppressed most of the time is referred to as sparsity limitation. The invention adopts a method of introducing sparsity constraints by using the Kullback-Leibler (KL) distance, as specifically described below.

First, the average value of each node output by the hidden layer is:

$$\overline{H} = \frac{1}{N} \sum_{n=1}^{N} h^{(n)}. \quad (10)$$

It is expected that the average output value of each node of the hidden layer can be as close to 0 as possible. Most of the nodes of the hidden layer are in a silent state. In order to quantify this characteristic of the hidden layer, it is generally assumed that each node of the hidden layer responds at a determined probability ρ (herein, ρ=0.05), and the nodes are independent of each other. The sparse regular term further constructed using the KL distance is:

$$KL(\rho \| \overline{H}(j)) = \rho \cdot \log\left(\frac{\rho}{\overline{H}(j)}\right) + (1-\rho) \cdot \log\left(\frac{1-\rho}{1-\overline{H}(j)}\right) \quad (11)$$

where $\overline{H}(j)$ is the $j^{th}$ element of $\overline{H}$, i.e., the average value of the response of the $j^{th}$ node of the hidden layer, wherein j=1, 2, . . . v. On the basis of the optimization objective formula (8) of the autoencoder network, the following optimization objective function of the sparse autoencoder network is obtained:

$$\min_{\theta} J(\theta) = \frac{1}{N} \sum_{n=1}^{N} \|\tilde{x}^{(n)} - x^{(n)}\|^2 + \delta \cdot R(\theta) + \mu \cdot \sum_{j=1}^{v} KL(\rho \| \overline{H}(j)) \quad (12)$$

where μ is the penalty factor. In order to obtain better results, the network is fine-tuned by using the back propagation algorithm and the gradient descent method to thereby achieve the purpose of updating the parameter θ, and the updated equations are as follows:

$$\begin{cases} W_v^{k+1} = W_v^k - \alpha \cdot \frac{\partial J(\theta)}{\partial W_v} \bigg|_{W_v^k} \\ b_v^{k+1} = b_v^k - \alpha \cdot \frac{\partial J(\theta)}{\partial b_v} \bigg|_{b_v^k} \\ W_h^{k+1} = W_h^k - \alpha \cdot \frac{\partial J(\theta)}{\partial W_h} \bigg|_{W_h^k} \\ b_h^{k+1} = b_h^k - \alpha \cdot \frac{\partial J(\theta)}{\partial b_h} \bigg|_{b_h^k} \end{cases} \quad (13)$$

In order to make the final feature data further reduced in dimensionality and being more representative, the invention adopts SSAE to cascade multiple sparse auto-encoders to complete the task of layer-by-layer feature extraction. The hidden layer features of the last sparse auto-encoder are obtained and input to the classifier for classification identification.

Figure 3:
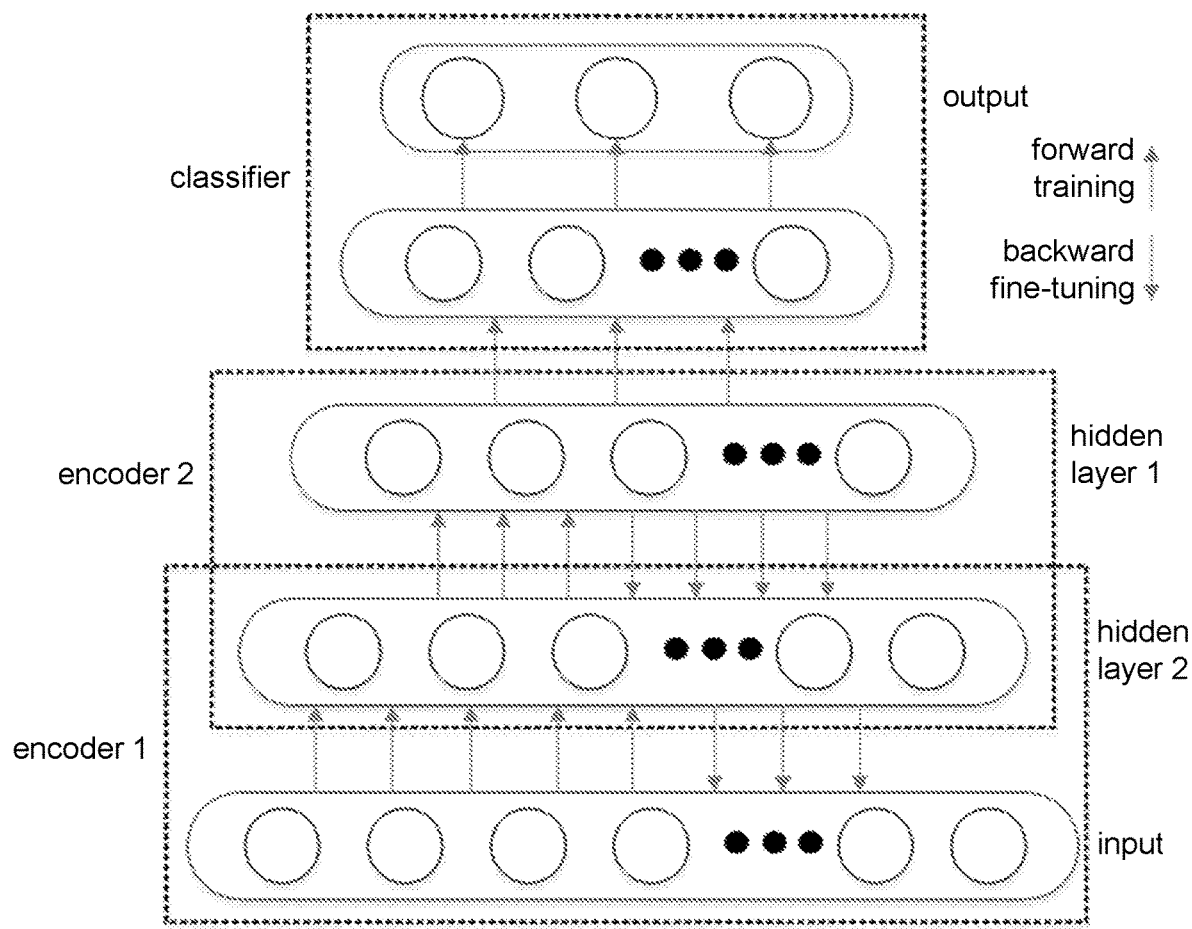
FIG. 3 is a structural diagram of SSAE network according to an embodiment of the invention.

Too many sparse auto-encoders will result in excessive parameters and unstable network training. But an insufficient number of layers may cause incomplete extraction of the high-dimensional features. Therefore, the invention selects a network composed of two layers of sparse auto-encoders to perform training and feature optimization on the fault data of the power electronic circuit. As shown in FIG. 3, it is composed of two auto-encoders (an input layer and two hidden layers) and one classifier, and the obtained feature data is then input to the classifier at the end of the network for classification and identification.

FIG. 1 is a simulation model of a three-phase voltage-type PWM rectifier. In the description below, fault diagnosis will be described by taking the circuit shown in FIG. 1 as the circuit to be diagnosed.

As shown in FIG. 1, a simulation model of a three-phase voltage-type PWM rectifier is established through MATLAB. The phase voltage amplitude of the grid is 200√2 V, the frequency is 50 Hz, the AC-side inductance is 1 mH, the parasitic resistance of the inductance is 0.5Ω, the DC-side capacitance C is 4000 μF, the shunt resistance is 10Ω, and the DC-side voltage is 600 V. It is assumed that the switching frequency is 10 kHz, the sampling frequency is 100 kHz, and the injected AC current $i_{de,in}=5 \sin(100\pi t)$. Its controllers consistently adopt a dual closed-loop structure. In a symmetric three-phase AC system, if only the AC fundamental component is considered, and, in the dq coordinate system, coupling is present among the dq components so the current is decoupled, then independent dq DC components can be obtained, thereby turning the current tracking system into a constant value adjustment system. By overlapping the d-axis with the Us-axis, the d-axis represents an active component reference value, and the q-axis represents a reactive component reference value, which thereby facilitates independent control of the active and reactive currents. In the invention, the q-axis current is controlled as 0 to ensure that the power-side power factor is 1, and the d-axis current is controlled to keep the DC-side output voltage constant.

Assuming that the output power is 0 under a no-load condition, if the output DC voltage is constant, then at this time, the d-axis current should be controlled to be 0, and the whole system is in a balanced state, which is unfavorable for fault signal extraction. Therefore, in order to collect an effective fault feature extraction amount on the DC output side, it is selected to inject an AC current of a specific frequency into the d-axis component of the AC-side current of the PWM rectifier, so that a ripple voltage of the same frequency is generated on the DC output side. In the invention, it is selected to inject a current $i_{de,in}=5 \sin(100\pi t)$ into the d-axis. Since the presence of the DC output side capacitance may compensate the voltage drop and harmonic changes resulting from some faults and thereby affect the normal detection of a fault, the DC-side current signal is selected as the fault feature signal herein.

Unlike the DC-side output voltage which can be directly measured, the DC-side output current is rarely measured directly. In contrast, the AC-side current is mostly measured to be used in current control and overcurrent protection. Therefore, the DC-side output current is indirectly measured and is reconstructed as the following formula by using the AC input current ($i_{as}$, $i_{bs}$, $i_{cs}$) and the switching function ($S_a$, $S_b$, $S_c$):

$$i_{dc} = S_a i_{as} + S_b i_{bs} + S_c i_{cs}$$

where when the upper-arm switching device is in an on-state, $S_i=1$(i=a, b, c); when the upper-arm switching device is in an off-state, $S_i=0$(i=a, b, c).

The invention selects the switching device IGBT, of which the failure rate is only lower than that of the electrolytic capacitor, as the subject of research. In most cases, an overvoltage or overcurrent causes uncontrollable conduction of its parasitic triode or diode, which results in switch breakdown and instantaneous failure. The invention mainly analyzes the open-circuit fault of the switching device IGBT and determines the IGBT fault type at different positions. The faults of the unit devices come in seven fault modes including the normal condition, as shown in Table 1. Sixty DC-side current signal samples are extracted from each fault mode, and each sample includes 10 k points.

TABLE 1

Fault classification and coding

| Fault type | Category | Code |
| --- | --- | --- |
| Normal | 0 | [1, 0, 0, 0, 0, 0, 0] |
| VT₁ breaking | 1 | [0, 1, 0, 0, 0, 0, 0] |
| VT₂ breaking | 2 | [0, 0, 1, 0, 0, 0, 0] |
| VT₃ breaking | 3 | [0, 0, 0, 1, 0, 0, 0] |
| VT₄ breaking | 4 | [0, 0, 0, 0, 1, 0, 0] |
| VT₅ breaking | 5 | [0, 0, 0, 0, 0, 1, 0] |
| VT₆ breaking | 6 | [0, 0, 0, 0, 0, 0, 1] |

EMD is performed on the current signals, the first 7-order IMF components are obtained, and 17 types of features thereof are calculated (see Table 2) to obtain 119 types of fault features in total. The sample dataset at this time is defined as the initial dataset A (420*119). Next, importance scores of the 119 types of features are calculated by using the ET algorithm and then sorted in a descending order. According to the descending order, the proportion of features of elimination is set to 0.6, and after elimination, a new dataset B (420*48) is obtained.

TABLE 2

Calculation methods of 17 types of features

| Feature | Calculation formula |
|---|---|
| Energy | $T_1 = \sum_{i=1}^{n} |x(i)|^2$ |
| Complexity | $T_2 = $ LZ complexity |
| Mean | $T_3 = \sqrt{\frac{1}{n}\sum_{i=1}^{n} x(i)}$ |
| Root mean square | $T_4 = \sqrt{\frac{1}{n}\sum_{i=1}^{n} |x(i)|^2}$ |
| Standard deviation | $T_5 = \sqrt{\frac{1}{n}\sum_{i=1}^{n} [x(i) - T_3]^2}$ |
| Skewness | $T_6 = \frac{1}{n-1}\sum_{i=1}^{n} \frac{[x(i) - T_3]^3}{T_5^3}$ |
| Kurtosis | $T_7 = \frac{1}{n-1}\sum_{i=1}^{n} \frac{[x(i) - T_3]^4}{(T_5^3 - 3)}$ |
| Waveform index | $T_8 = \frac{T_4}{|T_3|}$ |
| Margin index | $T_9 = \frac{\max x(i)}{\left[\frac{1}{n}\sum_{i=1}^{n} \sqrt{|x(i)|}\right]^2}$ |
| Pulse index | $T_{10} = \frac{\max x(i)}{|T_3|}$ |
| Crest value index | $T_{11} = \frac{\max x(i)}{T_4}$ |
| Kurtosis index | $T_{12} = \frac{\frac{1}{n}\sum_{i=1}^{n} x(i)^4}{T_4^4}$ |
| Center-of-gravity frequency | $T_{13} = \frac{\Sigma f \phi(f)}{\Sigma \phi(f)}$ |
| Mean square frequency | $T_{14} = \frac{\Sigma f^2 \phi(f)}{\Sigma \phi(f)}$ |
| Root mean square frequency | $T_{15} = \sqrt{T_{14}}$ |
| Frequency variance | $T_{16} = \frac{\Sigma (f - T_{13})^2 \phi(f)}{\Sigma \phi(f)}$ |
| Standard deviation of frequency | $T_{17} = \sqrt{T_{16}}$ |

The invention selects to construct a two-layer stacked sparse auto-encoder network structure and sets the stacked sparse auto-encoder network structure to 48-25-10 according to the dimensionality of the dataset B (where 48 is the number of feature values which are input, 25 is the number of nodes of the first sparse autoencoder hidden layer, and 10 is the number of nodes of the second sparse auto-encoder hidden layer). After the dataset B is normalized to [0, 1], the parameter of the sparse auto-encoders is initialized to 5, where the network parameter regularization coefficient δ is set to 0.01, the sparse regularization coefficient μ is set to 5, the learning rate of optimizing the network parameters by using the stochastic gradient method is set to 0.01, and the number of iterations is set to 500. Finally, the dataset B is dimensionally reduced through the sparse auto-encoder to obtain a dataset C (10*420).

Finally, the dataset C is normalized to [0, 1], and then the dataset is divided into a test set and a training set by a ratio of 0.3, which are respectively input to the MLP-Classifier. Upon testing and comparison, the settings of the parameters are:

Activation function: activation='relu';
Optimizer: solver='lbfgs';
Regularization term parameter: alpha=0.01;
Constant learning rate: learning_rate_init=0.001;
Number of hidden layer neurons: hidden_layer_sizes= (20, 10), and other settings are all default values.

The fault identification accuracy obtained by experimental simulation is as high as 97.62%. In comparison, the fault diagnosis accuracy obtained by using dimensionality reduction processing of the ET algorithm alone is 88.89%, and the fault diagnosis accuracy after using dimensionality reduction processing of the SSAE alone is 91.27%. The above evidences the effectiveness of a power electronic circuit fault diagnosis method based on ET and SSAE algorithm according to the invention.

The invention further provides a computer-readable storage medium having a computer program executable by a processor. The computer program performs steps of the power electronic circuit fault diagnosis method based on ET and SSAE algorithm according to the above-described technical solution.

In summary, the power electronic circuit fault diagnosis of the invention combines ET and SSAE algorithm. First, feature selection is performed through ET, and fault features with lower importance scores are discarded to avoid overfitting which occurs when the raw fault feature data is directly applied to train the classifier. Then, dimensionality of the fault features is reduced by using the stacked sparse auto-encoder method to avoid a long training time resulting from overly high dimensionality of the feature data and meanwhile effectively improve the accuracy of the power electronic circuit fault diagnosis, thereby achieving advantages that are not found in using one of the methods alone.

The invention has been exemplarily described above with reference to the drawings, and those skilled in the art may make various modifications and changes to the invention. Therefore, equivalent technical solutions also fall within the scope of the invention, and substantial improvements based on the concept and solution of the invention all fall within the protection scope of the invention. The contents that are not detailed in the specification are related art known to those skilled in the art.

What is claimed is:

1. A power electronic circuit fault diagnosis method based on an extremely random forest (ET) and a stacked sparse auto-encoder (SSAE) algorithm, comprising:
   1) signal collection and feature extraction, wherein empirical mode decomposition (EMD) is performed on current signals in each fault state of a power electronic circuit to obtain multi-order intrinsic mode function (IMF) components, and then time-domain features, frequency-domain features, and energy features of each order of the IMF components are calculated and used as an original features dataset;

2) fault feature dimensionality reduction preprocessing, wherein an importance of all features is calculated by using the ET algorithm, then the features are sorted in descending order according to a value of an importance score, and a new feature set is obtained by removing the features with a low importance score with a determined proportion;

3) extraction of fault features, wherein the SSAE is composed of multiple sparse auto-encoders which are used to reduce the dimension of fault features layer by layer, and hidden layer features of a final sparse auto-encoder are obtained;

4) classification training, wherein fault features samples under different fault conditions are divided into a training set and a test set according to the determined proportion, and the training set is used to train a classifier; and 5) mode identification, wherein by using the trained classifier, a fault identification and a fault location of a diagnosed power electronic circuit are carried out.

2. The power electronic circuit fault diagnosis method based on the ET and the SSAE algorithm according to claim 1, wherein in step 1), first 7-order IMF components are selected to calculate the fault features of the power electronic circuit.

3. A non-transitory computer-readable storage medium, having a computer program executable by a processor, the computer program performing steps of the power electronic circuit fault diagnosis method based on the ET and the SSAE algorithm according to claim 2.

4. The power electronic circuit fault diagnosis method based on the ET and the SSAE algorithm according to claim 1, wherein in step 3), a network composed of two layers of sparse auto-encoders is selected to optimize the fault features of the power electronic circuit.

5. A non-transitory computer-readable storage medium, having a computer program executable by a processor, the computer program performing steps of the power electronic circuit fault diagnosis method based on the ET and the SSAE algorithm according to claim 4.

6. The power electronic circuit fault diagnosis method based on the ET and the SSAE algorithm according to claim 1, wherein the ET algorithm in step 2) measures the value of the importance score by calculating Gini index of a decision tree node.

7. A non-transitory computer-readable storage medium, having a computer program executable by a processor, the computer program performing steps of the power electronic circuit fault diagnosis method based on the ET and the SSAE algorithm according to claim 6.

8. A non-transitory computer-readable storage medium, having a computer program executable by a processor, the computer program performing steps of the power electronic circuit fault diagnosis method based on an extremely random forest (ET) and a stacked sparse auto-encoder (SSAE) algorithm according to claim 1.

* * * * *